United States Patent
Lee et al.

(10) Patent No.: US 9,202,585 B2
(45) Date of Patent: Dec. 1, 2015

(54) NONVOLATILE MEMORY MODULE, MEMORY SYSTEM INCLUDING NONVOLATILE MEMORY MODULE, AND CONTROLLING METHOD OF NONVOLATILE MEMORY MODULE

(71) Applicants: Wonseok Lee, Suwon-si (KR); Youngkug Moon, Suwon-si (KR)

(72) Inventors: Wonseok Lee, Suwon-si (KR); Youngkug Moon, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/738,819

(22) Filed: Jun. 12, 2015

(65) Prior Publication Data

US 2015/0279475 A1 Oct. 1, 2015

Related U.S. Application Data

(63) Continuation of application No. 13/968,118, filed on Aug. 15, 2013, now Pat. No. 9,082,495.

(30) Foreign Application Priority Data

Sep. 7, 2012 (KR) .......................... 10-2012-0099508

(51) Int. Cl.
*G11C 7/10* (2006.01)
*G11C 16/28* (2006.01)
*G11C 14/00* (2006.01)
*G06F 12/02* (2006.01)
*G11C 13/00* (2006.01)

(52) U.S. Cl.
CPC ............ *G11C 16/28* (2013.01); *G06F 12/0246* (2013.01); *G11C 14/0045* (2013.01); *G06F 2212/7208* (2013.01); *G11C 7/10* (2013.01); *G11C 13/003* (2013.01)

(58) Field of Classification Search
CPC ....... G06F 5/10; G11C 7/1006; G11C 7/1018
USPC .................. 365/221, 130, 209, 225.5, 230.07
See application file for complete search history.

(56) References Cited

U.S. PATENT DOCUMENTS

| | | | |
|---|---|---|---|
| 6,243,282 B1 | 6/2001 | Rondeau, II et al. |
| 7,161,851 B2 | 1/2007 | Peterson et al. |
| 7,263,019 B2 | 8/2007 | Nierle et al. |
| 7,269,042 B2 | 9/2007 | Kinsley et al. |
| 8,036,015 B2 | 10/2011 | Ueda et al. |
| 8,045,415 B2 | 10/2011 | Janzen et al. |
| 8,159,886 B2 | 4/2012 | Miyamoto et al. |

(Continued)

OTHER PUBLICATIONS

Notice of Allowance for U.S. Appl. No. 13/968,118, mailed Mar. 13, 2015.

*Primary Examiner* — Jason Lappas
(74) *Attorney, Agent, or Firm* — Renaissance IP Law Group LLP

(57) ABSTRACT

A memory system is provided, which includes a nonvolatile memory module including a plurality of nonvolatile memory devices, and a memory module controller configured to control the nonvolatile memory module. At least two nonvolatile memory devices of the plurality of nonvolatile memory devices are configured to store serial presence detect (SPD) information. The memory module controller is configured to read the SPD information from the nonvolatile memory module and to set a communication mode with the nonvolatile memory module based on the read SPD information.

20 Claims, 10 Drawing Sheets

(56) References Cited

U.S. PATENT DOCUMENTS

| | | |
|---|---|---|
| 2003/0128596 A1 | 7/2003 | Peterson et al. |
| 2006/0198178 A1 | 9/2006 | Kinsley et al. |
| 2007/0058470 A1 | 3/2007 | Nierle et al. |
| 2008/0144411 A1 | 6/2008 | Tsern |
| 2009/0021991 A1 | 1/2009 | Miyamoto et al. |
| 2010/0142251 A1 | 6/2010 | Janzen et al. |
| 2010/0165701 A1 | 7/2010 | Ueda et al. |
| 2012/0099389 A1* | 4/2012 | Park et al. .................. 365/200 |

* cited by examiner

NONVOLATILE MEMORY MODULE, MEMORY SYSTEM INCLUDING NONVOLATILE MEMORY MODULE, AND CONTROLLING METHOD OF NONVOLATILE MEMORY MODULE

CROSS-REFERENCE TO RELATED APPLICATIONS

This U.S. non-provisional patent application is a continuation of U.S. patent application Ser. No. 13/968,118, filed Aug. 15, 2013 which claims priority under 35 U.S.C. §119 to Korean Patent Application No. 10-2012-0099508, filed Sep. 7, 2012, in the Korean Intellectual Property Office, the entire contents of which are hereby incorporated by reference.

BACKGROUND

The inventive concepts described herein relate to a nonvolatile memory module using a semiconductor memory as a storage element, a memory system including the nonvolatile memory module, and a control method of the nonvolatile memory module.

A semiconductor memory device is a memory device, which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

SUMMARY

One aspect of embodiments of the inventive concept is directed to provide a memory system which comprises a nonvolatile memory module including a plurality of nonvolatile memory devices, and a memory module controller configured to control the nonvolatile memory module, wherein at least two nonvolatile memory devices of the plurality of nonvolatile memory devices are configured to store serial presence detect (SPD) information, and wherein the memory module controller is configured to read the SPD information from the nonvolatile memory module and to set a communication mode with the nonvolatile memory module based on the read SPD information.

In example embodiments, each of the nonvolatile memory devices includes a magnetic random access memory.

In example embodiments, the at least two nonvolatile memory devices are configured to store the same SPD information.

In example embodiments, at power-on, the memory module controller sequentially selects the at least two nonvolatile memory devices and performs reading of the SPD information at the selected nonvolatile memory device until the SPD information is successfully read, and stores location information of the selected nonvolatile memory device from which the SPD information is successfully read.

In example embodiments, the memory module controller stores the location information in at least one of the nonvolatile memory devices.

In example embodiments, at power-on, the memory module controller sequentially selects the at least two nonvolatile memory devices, performs reading on the SPD information, and setting of the communication mode based on the read SPD information until setting of the communication mode with the nonvolatile memory module is successfully performed. The memory module controller also stores location information of a nonvolatile memory device from which the SPD information associated with the successful setting of the communication mode is read.

In example embodiments, the at least two nonvolatile memory devices are configured to store different SPD information, and the memory module controller sets the communication mode with the nonvolatile memory module by combining the different SPD information read from the at least two nonvolatile memory devices.

In example embodiments, at power-on, the memory module controller reads, in parallel, the different SPD information from the at least two nonvolatile memory devices.

In example embodiments, the plurality of nonvolatile memory devices is used as a working memory of an external processor.

In example embodiments, each of the at least two nonvolatile memory devices is configured to store first SPD information and second SPD information being a replica of the first SPD information.

In example embodiments, at power-on, the memory module controller sequentially selects the first SPD information and the second SPD information and performs reading and setting of the communication mode until setting of the communication mode is successfully performed, and stores location information of one, at which the setting of the communication mode is successfully performed, from among the first SPD information and the second SPD information.

Another aspect of embodiments of the inventive concept is directed to provide a nonvolatile memory module comprising a plurality of nonvolatile memory devices used as a working memory of an external processor, at least two nonvolatile memory devices of the plurality of nonvolatile memory devices being configured to store serial presence detect (SPD) information.

In example embodiments, at least one of the plurality of nonvolatile memory devices is configured to store location information of a nonvolatile memory device, from which the SPD information is to be read, from among the at least two nonvolatile memory devices.

Still another aspect of embodiments of the inventive concept is directed to provide a control method of a memory module, which includes a plurality of nonvolatile memory devices as a main memory, the control method comprising reading serial presence detect (SPD) information from at least one of at least two nonvolatile memory devices from among the plurality of nonvolatile memory devices, storing the SPD information, and setting a communication mode with the memory module based on the read SPD information.

In example embodiments, the control method further comprises reading the SPD information from the other one of the at least two nonvolatile memory devices when the setting of the communication mode fails, and setting the communication mode with the memory module based on the SPD information read from the other one of the at least two nonvolatile memory devices.

In example embodiments, a nonvolatile memory module comprises first through nth nonvolatile memory devices; and first through nth serial presence detect (SPD) areas, each of the first through nth SPD areas associated with a corresponding one of the first through nth nonvolatile memory devices.

In example embodiments, the nonvolatile memory module further comprises a chip information area associated with one of the first through nth nonvolatile memory devices, wherein the chip information area is configured to store location information of a nonvolatile device from among the first through nth nonvolatile memory devices having stored thereon serial presence detect (SPD) information.

Each of the first through nth serial presence detect (SPD) areas can be configured to store a same copy of SPD information. The SPD information can be configured to be read from at least one of the first through nth SPD areas responsive to a sequential read command.

In example embodiments, each of the first through nth serial presence detect (SPD) areas includes a first sector, a second sector, and a third sector, each of the first sectors includes sub SPD information that together constitute SPD information, each of the second sectors includes sub SPD information that together constitute the SPD information, and each of the third sectors includes sub SPD information that together constitute the SPD information.

In example embodiments, the SPD information is configured to be read from the first sectors responsive to a parallel read command.

In example embodiments, upon failure of reading the SPD information from the first sectors, the SPD information is configured to be read from the second sectors responsive to the parallel read command.

In example embodiments, upon failure of reading the SPD information from the second sectors, the SPD information is configured to be read from the third sectors responsive to the parallel read command.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
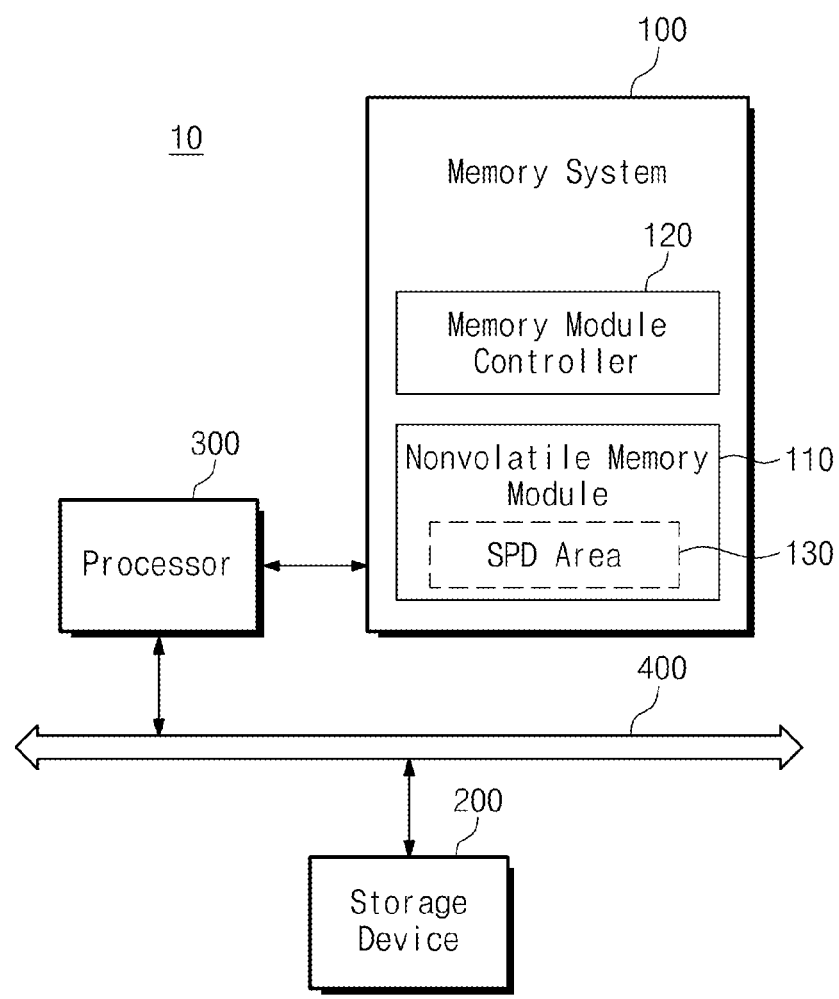
FIG. 1 is a block diagram schematically illustrating a computing system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
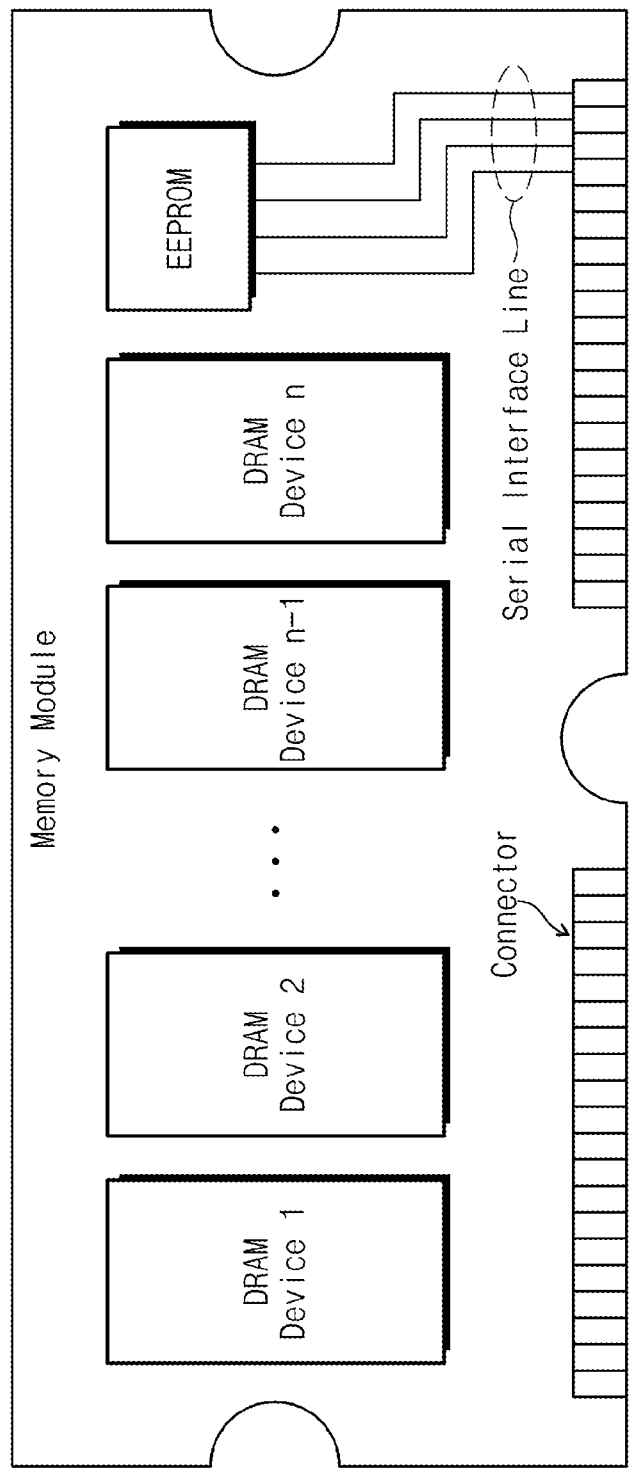
FIG. 2 is a diagram schematically illustrating a memory module using DRAMs.

FIG. 1 is a block diagram schematically illustrating a computing system according to an embodiment of the inventive concept. FIG. 2 is a diagram schematically illustrating a memory module using DRAMs. Reference is now made to FIGS. 1 and 2.

In general, a memory module may use a volatile memory element as a storage element. For example, as illustrated in FIG. 2, a general memory module may use a plurality of DRAM devices as storage medium. In this case, an access speed, a memory size, and maker information on the DRAM devices may be different according to a type of memory module. For example, a single inline memory module (SIMM) may provide a 32-bit access speed, and a dual inline memory module (DIMM) may provide a 64-bit access speed.

For a controller to recognize a memory module, the memory module may provide the controller with serial presence detect (SPD) information such as an access speed, a memory size, maker information, and so on. The SPD information may continue to be maintained. The SPD information cannot be stored at a DRAM device due to a volatile characteristic of the DRAM device. The general memory module may be equipped with an EEPROM device to store the SPD information. However, the inclusion of the EEPROM may cause an increase in a manufacturing cost of the memory module.

In the event that a read operation on the SPD information fails due to a faulty EEPROM, even though DRAM devices in the memory module might still be functioning normally, the whole of the memory module may become inoperable, abnormally recognized, or otherwise unsuitable for use.

To solve this problem, a memory module according to an embodiment of the inventive concept may use a plurality of nonvolatile memory devices as a working memory, and SPD information may be stored in at least one of the plurality of nonvolatile memory devices. Thus, since the memory module is no longer dependent on the EEPROM to store the SPD information, the EEPROM may be eliminated, thereby reducing a manufacturing cost of the memory module.

The memory module according to an embodiment of the inventive concept may store multiple copies of the SPD information at the plurality of nonvolatile memory devices. Alternatively, the SPD information may be distributed into the plurality of nonvolatile memory devices. Thus, it is possible to prevent the whole of the memory module from being rendered inoperable, or otherwise abnormally recognized, due to a read failure of the SPD information.

Referring to FIG. 1, a computing system 10 according to an embodiment of the inventive concept may include a memory system 100, a storage device 200, a processor 300, and a system bus 400.

The storage device 200 may store user data. For example, the storage device 200 may include a hard disk drive (HDD) or a nonvolatile memory such as a flash memory, a phase change RAM (PRAM), a magnetic RAM (MRAM), a resistive RAM (RRAM), a ferroelectric RAM, or the like.

The memory system 100 may be used as a working memory of the computing system 10. The memory system 100 may be configured to store data processed by the processor 300. The memory system 100 may include a nonvolatile memory module 110 and a memory module controller 120.

The nonvolatile memory module 110 may be implemented by a nonvolatile memory such as a magnetic RAM (MRAM). In other example embodiments, the nonvolatile memory module 110 may be implemented by a phase change RAM using a phase change material or a resistive RAM (RRAM) having a variable resistance material such as a transition metal oxide material.

The nonvolatile memory controller 120 may be configured to control the nonvolatile memory module 110 according to a control of the processor 300. The nonvolatile memory controller 120 may receive a write command and write data from the processor 300, and may control the nonvolatile memory module 110 to store the write data. The nonvolatile memory controller 120 may receive a read command from the processor 300, and may control the nonvolatile memory module 110 to perform a read operation, corresponding to requested data, from among data stored at the nonvolatile memory module 110.

The nonvolatile memory module 110 may include a plurality of nonvolatile memory devices. For example, each nonvolatile memory device of the nonvolatile memory module 110 may be formed of the MRAM, which is particularly efficient for reading and writing data by the byte. In other example embodiments, each nonvolatile memory device of the nonvolatile memory module 110 may be formed of the PRAM or the RRAM. The nonvolatile memory module 110 may include an SPD area 130.

The SPD area 130 may store SPD information, and the SPD information on the nonvolatile memory module 110 may be provided to the memory module controller at power-on. For example, at power-on, the memory module controller 120 may perform an optimal setting operation between the memory module controller 120 and the nonvolatile memory module 110 by performing a read operation on the SPD information stored at the SPD area 130.

In example embodiments, the SPD information may be stored in at least one of the plurality of nonvolatile memory devices of the nonvolatile memory module 110, which is more fully described below with reference to FIG. 3.

In other example embodiments, the SPD information may be stored in at least two nonvolatile memory devices of the plurality of nonvolatile memory device of the nonvolatile memory module 110, respectively. This is more fully described below with reference to FIGS. 7 and 8.

In still other example embodiments, the SPD information may be divided into a plurality of sub SPD information sections, and the plurality of sub SPD information sections may be distributed and stored into at least two nonvolatile memory devices of the plurality of nonvolatile memory device of the nonvolatile memory module 110. In this case, the SPD area 130 may be configured or stored within at least two of the nonvolatile memory devices. This is more fully described below with reference to FIGS. 9 and 10.

The memory module controller 120 may control the nonvolatile memory module 110. At power-on, the memory module controller 120 may access the SPD area 130 of the nonvolatile memory module 110 to receive the SPD information from the SPD area 130. The memory module controller 120 may read the SPD information from the nonvolatile memory module 110 and set a communication mode with the nonvolatile memory module 110 based on the read SPD information. Upon mode setting, the memory module controller 120 may perform an optimal setting operation on the nonvolatile memory module 110 based on the read SPD information.

As described above, the nonvolatile memory module 110 may include a plurality of nonvolatile memory devices, and the SPD information may be stored in at least one of the plurality of nonvolatile memory devices. Since the EEPROM for storing the SPD information is not required, a manufacturing cost of the memory module may be reduced. Also, since the SPD information may be iteratively stored at the plurality of nonvolatile memory devices, it is possible to prevent the memory module from being rendered inoperable, or otherwise abnormally recognized, due to a failure to read the SPD information.

Figure 3:
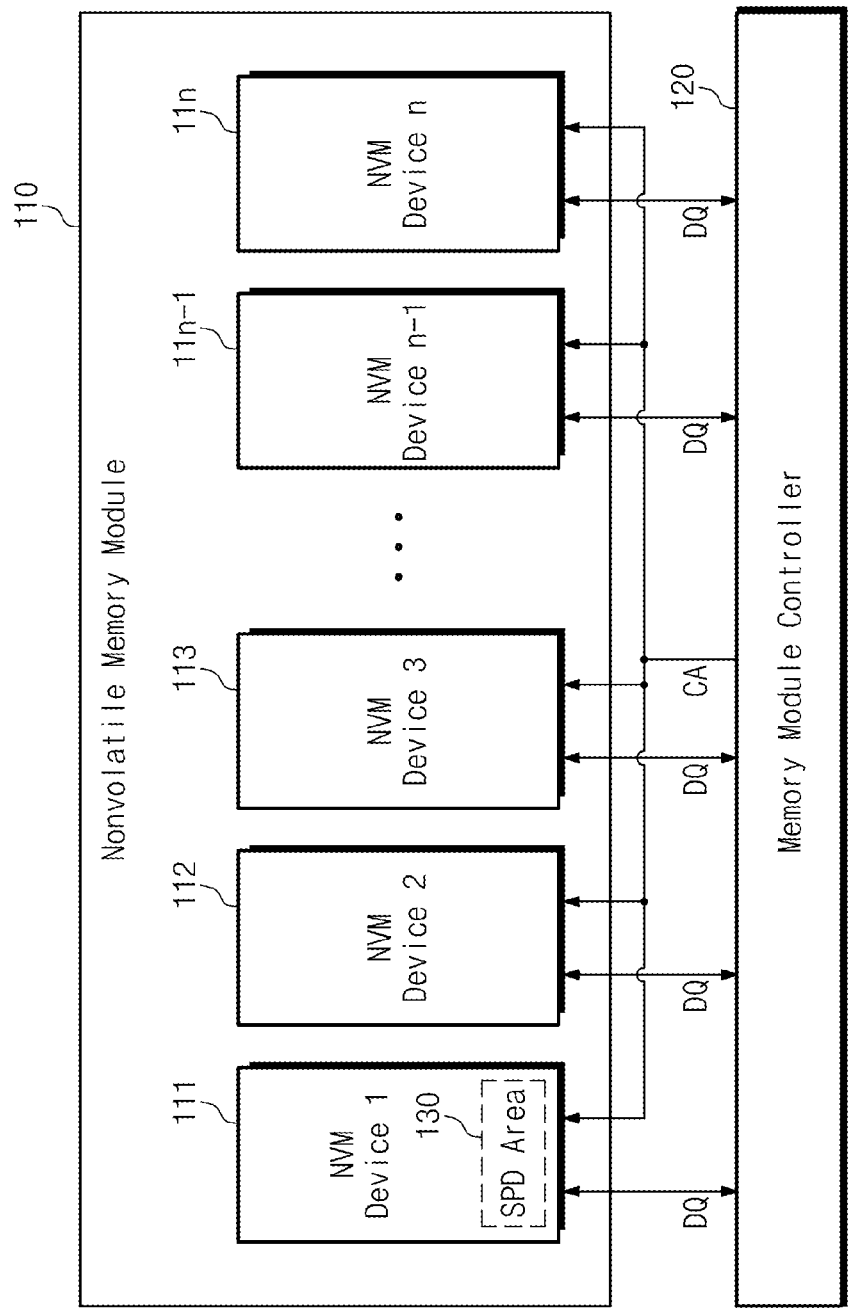
FIG. 3 is a diagram schematically illustrating a nonvolatile memory module in FIG. 1.

FIG. 3 is a diagram schematically illustrating a nonvolatile memory module in FIG. 1. FIG. 3 illustrates an example in which SPD information is stored at a nonvolatile memory device.

Referring to FIG. 3, a nonvolatile memory module 110 may include a plurality of nonvolatile memory devices 111 to 11n. Each of the nonvolatile memory devices 111 to 11n may exchange data DQ with a memory module controller 120 in response to a control of the memory module controller 120.

The nonvolatile memory module 110 may receive a command CA from the memory module controller 120. Each of the nonvolatile memory devices 111 to 11n may perform a read or write operation in response to the command CA from the memory module controller 120.

For example, the nonvolatile memory devices 111 to 11n may perform a read or write operation in parallel. That is, the nonvolatile memory devices 111 to 11n may perform a read or write operation independently and/or simultaneously. In other example embodiments, read or write operations of the nonvolatile memory devices 111 to 11n may be performed sequentially.

In example embodiments, SPD information may be stored at one of the nonvolatile memory devices 111 to 11n. For example, the SPD information may be stored at the nonvolatile memory device 111. More specifically, the nonvolatile memory device 111 includes an SPD area 130 at which the SPD information can be stored. The specific structure of the nonvolatile memory device 111 in which the SPD information is stored will be more fully described below with reference to FIGS. 4 to 6.

In example embodiments, at power-on, the memory module controller 120 may access the nonvolatile memory device 111. The memory module controller 120 may control the nonvolatile memory device 111 such that a read operation on SPD information stored at the nonvolatile memory device 111 is performed. In accordance with an embodiment of the inventive concept, since EEPROM to store SPD information is not separately required, a manufacturing cost of the nonvolatile memory module 110 may be reduced.

The memory module controller 120 may perform an optimal setting operation with the nonvolatile memory module 110 using the SPD information read from the nonvolatile memory device 111.

Figure 4:
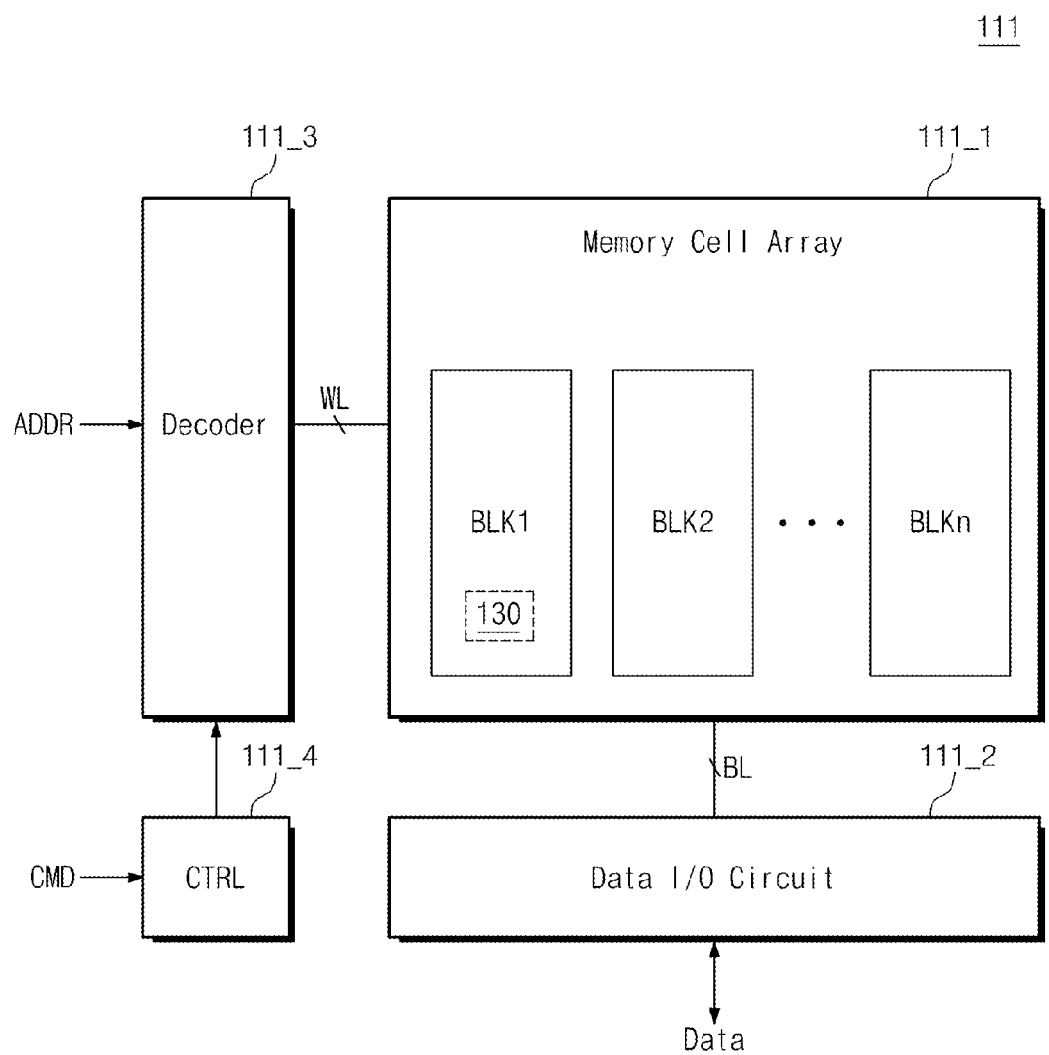
FIG. 4 is a block diagram schematically illustrating a nonvolatile memory device of FIG. 3.

FIG. 4 is a block diagram schematically illustrating a nonvolatile memory device of FIG. 3. Referring to FIG. 4, a nonvolatile memory device 111 may include a memory cell array 111_1, a data input/output circuit 111_2, a decoder 111_3, and control logic 111_4.

The memory cell array 111_1 may include a plurality of blocks BLK1 to BLKn, each of which includes a plurality of memory cells. The memory cells may be implemented by spin transfer magneto resistive random access memory (STT-MRAM) cells.

In this case, each memory cell may include a magnetic tunnel junction (MTJ) element having magnetic material. The memory cell array 111_1 and the associated memory cells are more fully described below with reference to FIGS. 5 to 15.

The data input/output circuit 111_2 may be connected with the memory cell array 111_1 via bit lines BL. The data input/output circuit 111_2 may receive data from an external device to store it at the memory cell array 111_1. The data input/output circuit 111_2 may read data from the memory cell array 111_1 and transfer the read data to the external device.

In the case that the memory cells of the memory cell array 111_1 are formed of STT-MRAM cells, the data input/output circuit 111_2 may provide a write current and a read current to the memory cell array 111_1. For example, at a write operation, the data input/output circuit 111_2 may provide a write current to the memory cell array 111_1. At a read operation, the data input/output circuit 111_2 may provide a read current to the memory cell array 111_1.

Also, the data input/output circuit 111_2 may include a plurality of sense amplifiers. For example, at a read operation, a sense amplifier may receive a data voltage via a bit line to compare the input data voltage with a reference voltage. The sense amplifier may output a comparison result as a data signal having a digital level.

The decoder 111_3 may be connected with the memory cell array 111_1 via word lines WL. The decoder 111_3 may select a word line corresponding to an address ADDR received from the external device.

The control logic 111_4 may control an overall operation of the nonvolatile memory device 111. For example, at a write operation, the control logic 111_4 may control the nonvolatile memory device 111 such that data received from the external device is stored at the memory cell array 111_1. At a read operation, the control logic 111_4 may control the nonvolatile memory device 111 such that a read operation on data stored at the memory cell array 111_1 is performed.

In example embodiments, an area of the memory cell array 111_1 may be set to an area (hereinafter, referred to as an SPD area) for storing SPD information. For example, as illustrated in FIG. 4, a part of the block BLK1 in the memory cell array 111_1 may be set to the SPD area 130. However, the inventive concept is not limited thereto. For example, the whole of the block BLK1 may be set to the SPD area 130. Alternatively, at least two blocks or a part of each of at least two blocks may be set to the SPD area 130.

At power-on, a read operation may be performed to read SPD information stored at the SPD area 130. For example, at power-on, the control logic 111_4 may respond to a read request on the SPD information to control the nonvolatile memory device 111 such that a read operation on the SPD area 130 is performed. The read SPD information may be provided to a memory module controller (e.g., 120 of FIG. 3) via the data input/output circuit 111_2.

Nonvolatile memory devices 112 to 11n in FIG. 3 may be similar in operation and configuration to the nonvolatile memory device 111, and a description thereof is thus omitted.

Figure 5:
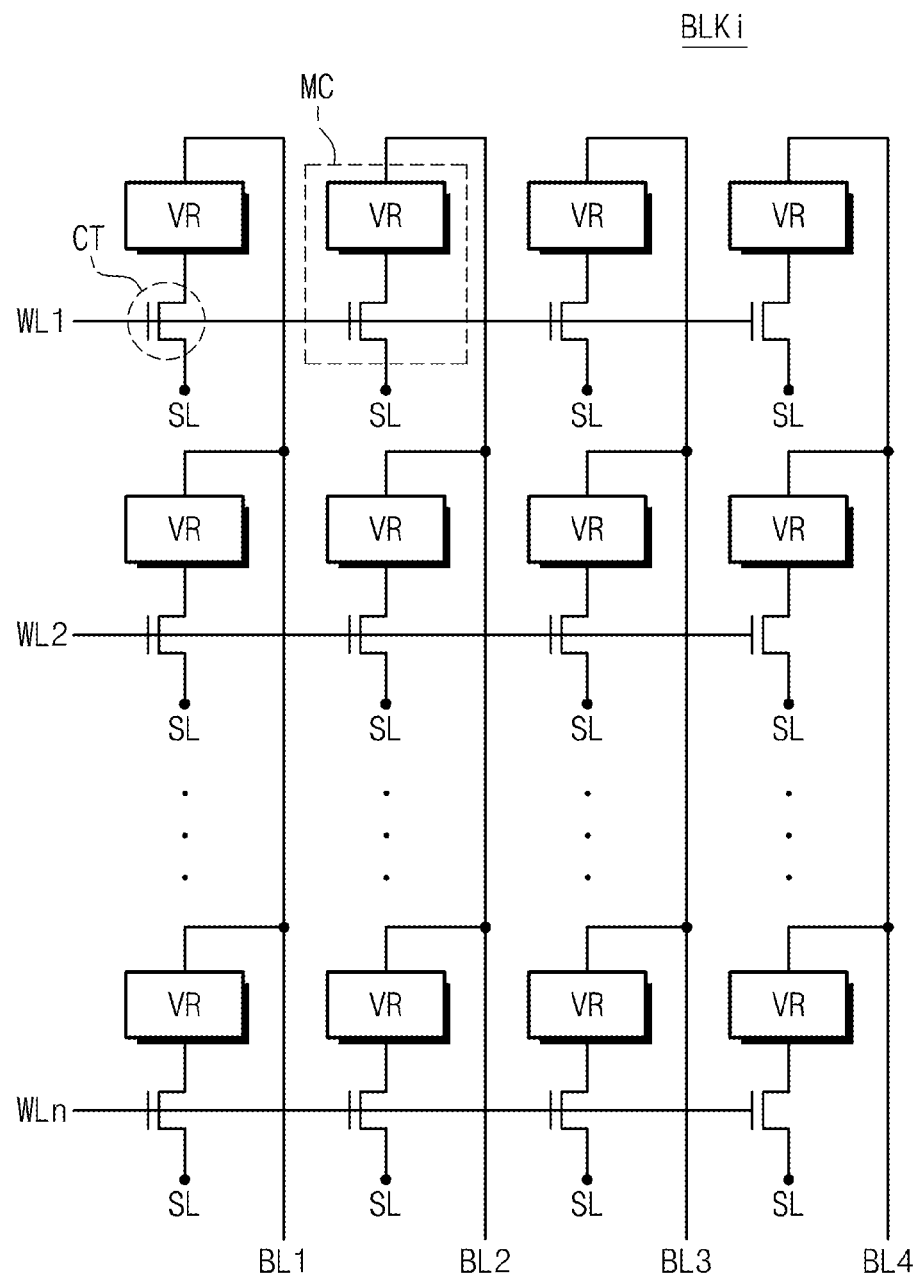
FIG. 5 is a diagram illustrating a structure of a memory cell array in FIG. 4.

FIG. 5 is a diagram illustrating a structure of a memory cell array in FIG. 4. In FIG. 5, there is illustrated a block BLKi of a memory cell array 111_1 (of FIG. 4). For ease of description, it is assumed that the block BLKi is connected to four bit lines BL1 to BL4.

Referring to FIG. 5, the block BLKi may include a plurality of memory cells MC, each of which has a variable resistance element VR and a cell transistor CT.

The variable resistance element VR may have a resistance value, which is varied according to a magnitude and a direction of an applied current (or, voltage). Even when a current (or, voltage) is not provided to the variable resistance element VR, a resistance value of the variable resistance element VR may be retained. That is, the variable resistance element VR has nonvolatile characteristics.

The variable resistance element VR may be formed of various elements. For example, the variable resistance element VR may be formed of an STT-MRAM element, for example. By way of another example, the variable resistance element VR may be implemented using a Phase Change Random Access Memory (PRAM) element, a Resistive Random Access Memory (RRAM) element using a variable resistance material such as complex metal oxide, or a Magnetic Random Access Memory (MRAM) element using a ferromagnetic material.

In each memory cell MC, a gate of a cell transistor CT may be connected to a word line. The cell transistor CT may be switched by a signal provided through the word line. A drain of the cell transistor CT may be connected to the variable resistance element VR, and its source may be connected to a source line SL.

For example, sources of cell transistors CT in the memory cells MC may be connected to the same source line. As another example, sources of cell transistors CT in the memory cells MC may be connected to different source lines, respectively.

Figure 6:
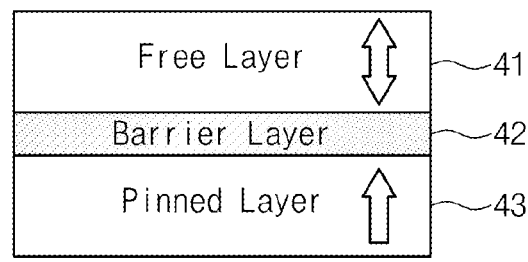
FIG. 6 is a diagram schematically illustrating a memory cell in FIG. 5.

FIG. 6 is a diagram schematically illustrating a memory cell in FIG. 5. In a variable resistance element the magnetization direction of which is vertical, a transfer direction of a current may be substantially parallel with a magnetization easy axis. Referring to FIG. 6, a variable resistance element VR may include a free layer 41, a pinned layer 43, and a tunnel or barrier layer 42.

A resistance value may decrease when a magnetization direction of the free layer 41 is parallel with a magnetization direction of the pinned layer 43. A resistance value may increase when a magnetization direction of the free layer 41 is anti-parallel with a magnetization direction of the pinned layer 43. Data may be stored according to a resistance value.

To realize a variable resistance element the magnetization direction of which is vertical, preferably, the free and pinned layers 41 and 43 may be formed of a material having large magnetic anisotropy energy. The material having large magnetic anisotropy energy may include amorphous rare earth element alloy, multi-layer film such as (Co/Pt)n or (Fe/Pt)n, and an ordered lattice material having an L10 crystal structure.

For example, the free layer 41 may be an ordered alloy, and may include at least one of iron (Fe), cobalt (Co), palladium (Pd), and platinum (Pt). For example, the free layer 41 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. In a chemical quantitative expression, the alloys may be Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy, and may include at least one of iron (Fe), cobalt (Co), palladium (Pd), and platinum (Pt). For example, the pinned layer 43 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. In a chemical quantitative expression, the alloys may be Fe50Pt50, Fe50Pd50, Co50Pd50, Co50Pt50, Fe30Ni20Pt50, Co30Fe20Pt50, or Co30Ni20Pt50.

As described with reference to FIGS. 5 and 6, each nonvolatile memory device of a nonvolatile memory module 110 (of FIG. 1) may use MRAM as a storage medium. Since the MRAM supports fast read and write speeds and an overwrite operation, it may be used as a main memory of a computing system 10 instead of DRAM.

As described with reference to FIGS. 1 to 4, the nonvolatile memory module 110 using the MRAM as the storage medium need not include separate EEPROM. Thus, a manufacturing cost of the nonvolatile memory module 110 may be reduced in comparison with a general memory module (as explained above with reference to FIG. 2).

Figure 7:
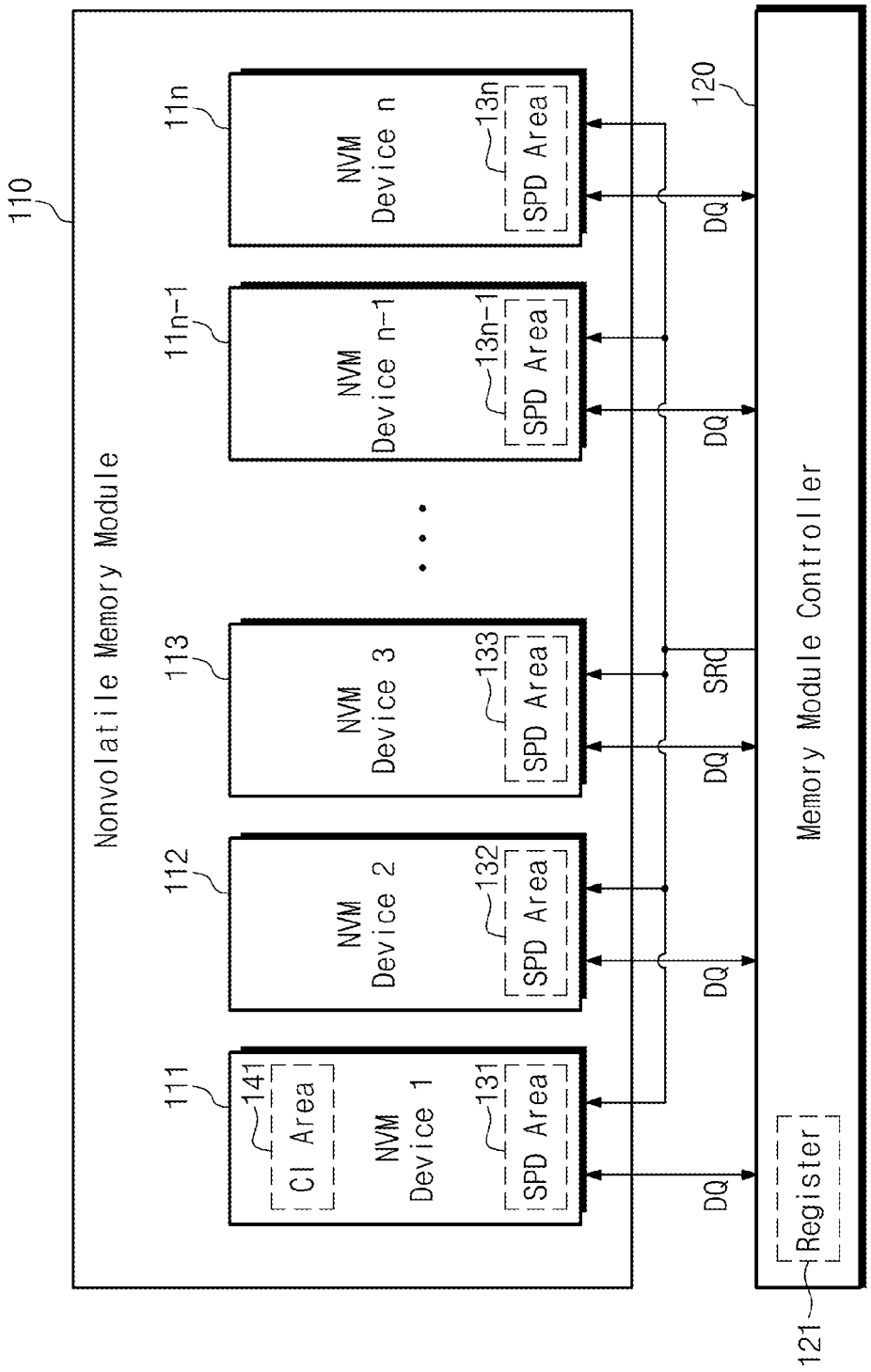
FIG. 7 is a block diagram schematically illustrating a nonvolatile memory module and a memory module controller according to another embodiment of the inventive concept.

FIG. 7 is a block diagram schematically illustrating a nonvolatile memory module and a memory module controller according to another embodiment of the inventive concept. The nonvolatile memory module and the memory module controller in FIG. 7 may be similar to the nonvolatile memory module and the memory module controller in FIG. 3. Thus, same or similar components are illustrated using same or similar reference numerals, and the description of these components is not repeated.

In a nonvolatile memory module 110 of FIG. 7, the same SPD information may be stored in at least two nonvolatile memory devices. In this case, even when a read operation fails on SPD information stored at one nonvolatile memory device, SPD information stored at the other nonvolatile memory device may be read. Thus, it is possible to prevent the whole of the nonvolatile memory module 110 from being rendered inoperable or abnormal due to a read failure of the SPD information.

The nonvolatile memory module 110 may include a plurality of nonvolatile memory devices 111 to 11n, each of which includes an SPD area. SPD information may be stored at the SPD areas 131 to 13n. Read operations on SPD information stored at the nonvolatile memory devices 111 to 11n may be performed sequentially.

If a read operation fails on SPD information stored at the nonvolatile memory device 111, a read operation on SPD information stored at the nonvolatile memory device 112 may be performed, which stores a replica of the SPD information. If a read operation fails on SPD information stored at the nonvolatile memory device 112, a read operation on SPD information stored at the nonvolatile memory device 113 may be performed, which also stores a replica of the SPD information. This iterative approach to accessing the SPD information under failure conditions can be repeated across the nonvolatile memory devices such as 11n-1 and 11n. In this manner, it is possible to prevent the whole of the memory module from being rendered inoperable or processed abnormally due to read fail of the SPD information.

Moreover, multiple points of failure can occur (e.g., read errors on multiple nonvolatile memory devices), and the memory module can recover in a robust manner by accessing the SPD information from any one of a number of nonvolatile memory devices of the memory module.

To rapidly search a location of a nonvolatile memory device, which stores valid SPD information, the nonvolatile memory module 110 and the memory module controller 120 may include a chip information area (e.g., CI area 141) and a register (e.g., register 121), respectively. Location information of a nonvolatile memory device, which stores valid SPD information, may be checked by accessing the chip information area 141 at power-on. Thus, the memory module controller 120 may perform an SPD read operation more rapidly.

One of the nonvolatile memory devices 111 to 11*n* may include the chip information area 141. For example, an area of the nonvolatile memory device 111 may be set to the chip information area 141.

The chip information area 141 may be used to store location information of a nonvolatile memory device, which stores valid SPD information, from among the nonvolatile memory devices 111 to 11*n*. Location information of a nonvolatile memory device, which stores valid SPD information may be referred to as a success chip number.

For example, in the case that a read operation on the SPD area 131 of the nonvolatile memory device 111 is successful, a chip number of the nonvolatile memory device 111 may be stored at the chip information area 141. By way of another example, in the case that a read operation on the SPD area 132 of the nonvolatile memory device 112 is successful, a chip number of the nonvolatile memory device 112 may be stored at the chip information area 141, and so forth.

The memory module controller 120 may include a register 121. The register 121 may be used to store location information of a nonvolatile memory device, which stores valid SPD information, from among the nonvolatile memory devices 111 to 11*n*. Location information of a nonvolatile memory device stored at the register 121 may also be stored at the chip information area 141 before power-off of the nonvolatile memory module 110.

At power-on, the memory module controller 120 may perform a read operation on SPD information more rapidly by checking a success chip number stored at the chip information area 141, and reading the SPD information directly from the nonvolatile memory device associated with the stored success chip number.

Figure 8:
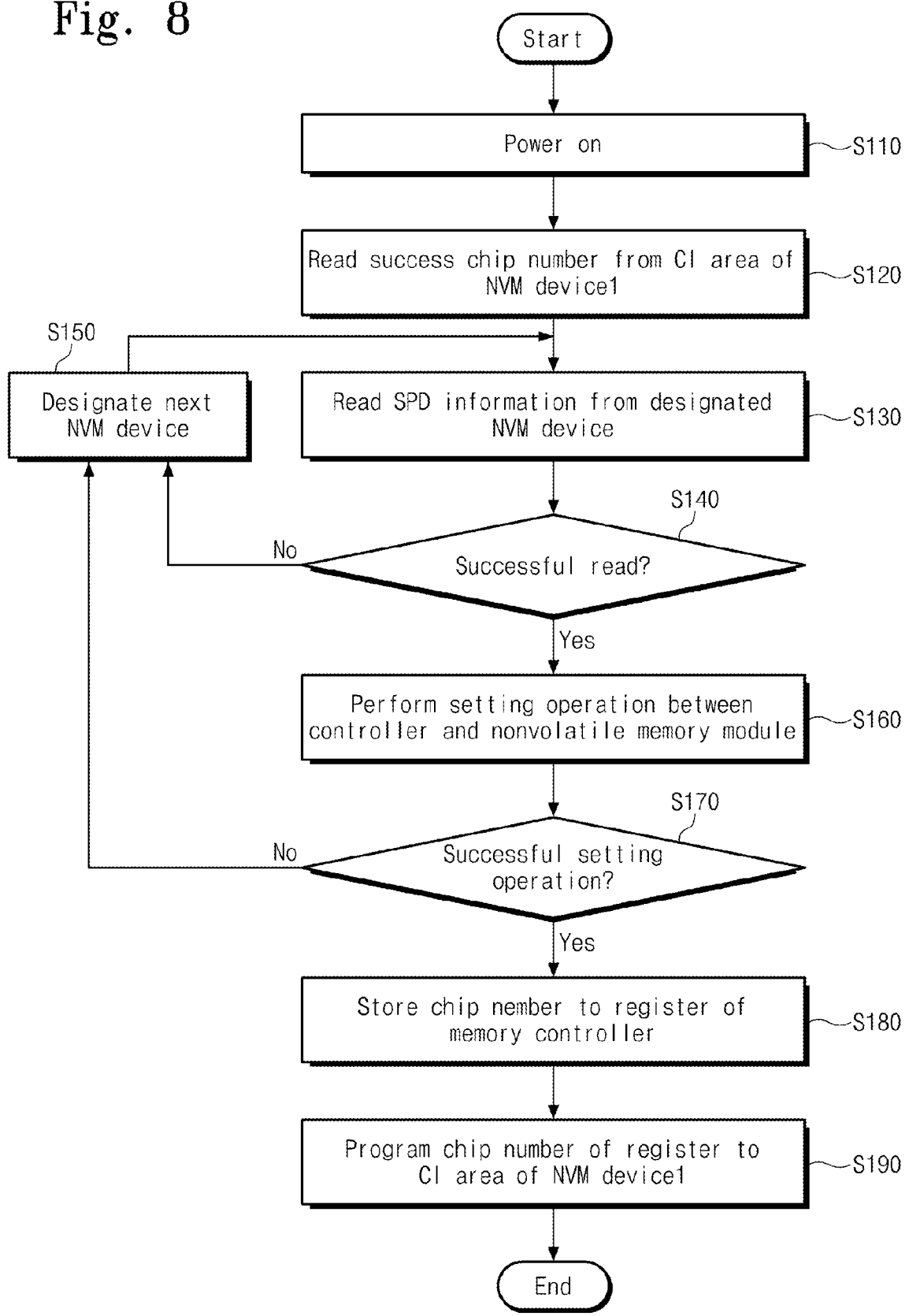
FIG. 8 is a flow chart illustrating operations of a nonvolatile memory module and a memory module controller of FIG. 7.

FIG. 8 is a flow chart illustrating operations of a nonvolatile memory module and a memory module controller of FIG. 7. The operations of the nonvolatile memory module 110 and the memory module controller 120 are more fully described below with reference to FIGS. 7 and 8. For ease of description, as illustrated in FIG. 7, it is assumed that the nonvolatile memory device 111 includes a chip information area 141.

In operation S110, a computing system 10 (refer to FIG. 1) may be powered on. In operation S120, a read operation may be performed on a success chip number stored at the chip information area 141 of the nonvolatile memory device. That is, the memory module controller 120 may send a read request on a success chip number stored at the chip information area 141 to the nonvolatile memory device 111. The nonvolatile memory device 111 may perform a read operation to access the success chip number stored at the chip information area 141, and may send a read result to the memory module controller 120.

In operation S130, a read operation may be performed on SPD information stored at a nonvolatile memory device corresponding to the success chip number. More specifically, the memory module controller 120 may send a read request to a nonvolatile memory device previously designated to store valid SPD information at a previous power-on, based on the success chip number. Accordingly, the nonvolatile memory device corresponding to the success chip number may perform a read operation on SPD information. For ease of description, it is assumed that the nonvolatile memory device 111 corresponds to the success chip number, even though it will be understood by persons with skill in the art that any suitable number or indicia can be used.

In operation S140, a determination can be made whether a read operation on the SPD information is successful or not. More specifically, a determination can be made whether a read operation of the SPD information on the nonvolatile memory device corresponding to the success chip number is a success or a failure. If the read operation on the SPD information fails, the flow proceeds to operation S150, where a next nonvolatile memory device may be designated as a nonvolatile memory device at which an SPD read operation can be newly performed.

For example, in the case that a read operation fails on the SPD information of the nonvolatile memory device 111, the memory module controller 120 may send a sequential read command SRC (of FIG. 7) to the nonvolatile memory module 110. In this case, the nonvolatile memory module 110 may newly designate a nonvolatile memory device 112 in response to the sequential read command SRC. Afterwards, a read operation on the SPD information of the nonvolatile memory device 112 may be performed. The sequential read command SRC may include, for example, a chip ID for selecting a nonvolatile memory device.

If a read operation on the SPD information is successful at S140, the flow proceeds to operation S160, where a setting operation between the memory module controller 120 and the nonvolatile memory module 110 may be performed.

In operation S170, a determination can be made whether the setting operation is successful or not. If the setting operation between the memory module controller 120 and the nonvolatile memory module 110 fails, the flow proceeds to operation S150, in which a next nonvolatile memory device may be designated as a nonvolatile memory device at which an SPD read operation is to be newly performed. Afterwards, the method returns to operation S130.

Otherwise, if the setting operation between the memory module controller 120 and the nonvolatile memory module 110 is successful, the flow proceeds to operation S180, where location information of a corresponding nonvolatile memory device may be stored at the register 121 of the memory module controller 120. That is, location information of a nonvolatile memory device at which a read operation on the SPD information is successfully performed may be stored at the register 121 as success chip information.

In operation S190, the success chip information stored at the register 121 may be also stored at the chip information area 141 of the nonvolatile memory device 111.

Determining whether a read operation of the SPD information is successful (S140) may include checking and correcting an error on the read SPD information. In the case that the memory module controller 120 does not support an error checking function on the SPD information, the operation S140 may be skipped.

As described with reference to FIGS. 7 and 8, the nonvolatile memory module 110 may include a plurality of nonvolatile memory devices, and SPD information may be stored in at least two of the nonvolatile memory devices. Thus, it is possible to prevent the whole of the nonvolatile memory module 110 from being rendered inoperable, abnormally recognized, or otherwise made unsuitable for use. Also, a read operation on SPD information may be performed more quickly by storing a success chip number at the chip information area 141.

Figure 9:
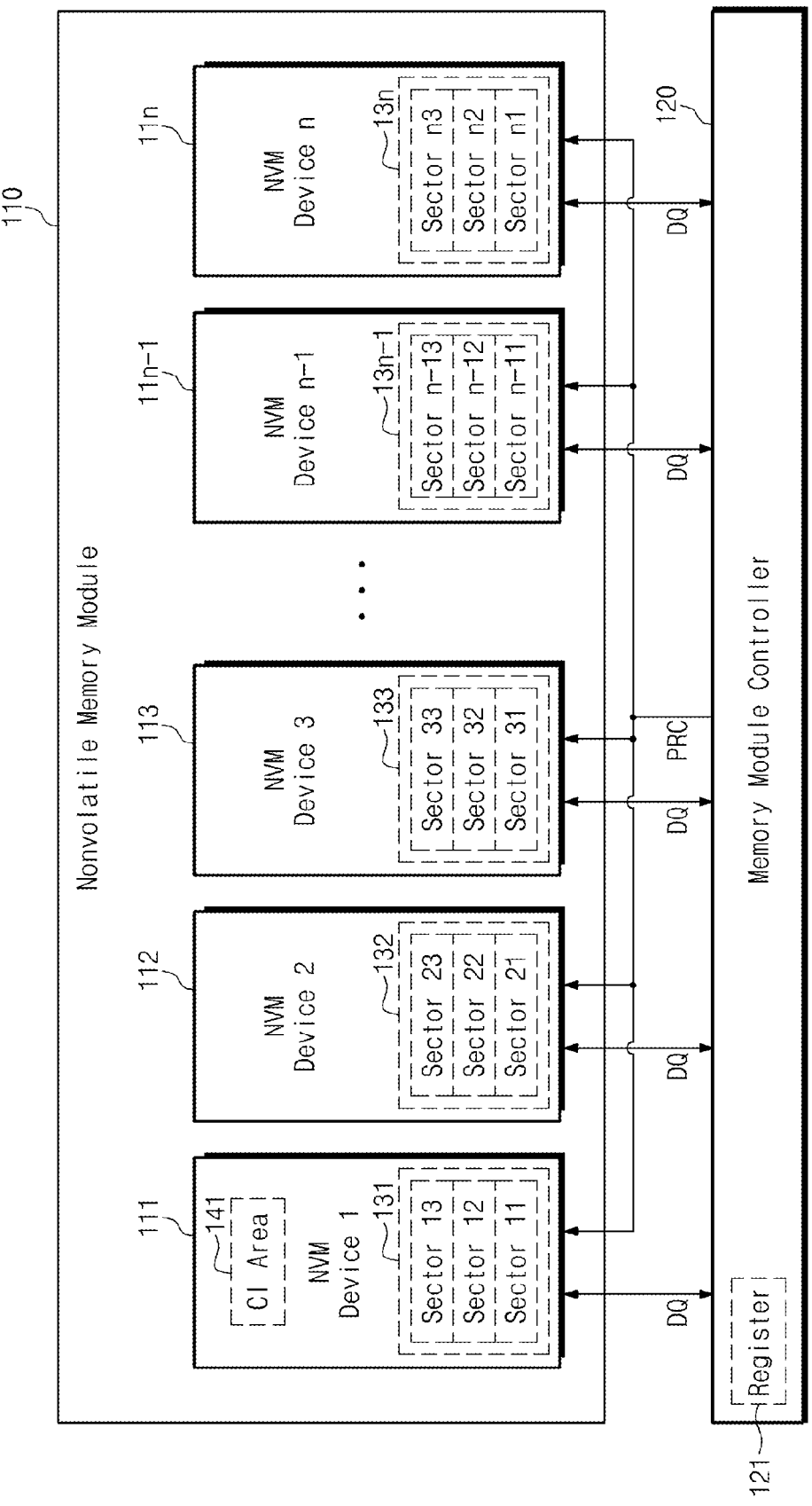
FIG. 9 is a block diagram schematically illustrating a nonvolatile memory module and a memory module controller according to still another embodiment of the inventive concept.

FIG. 9 is a block diagram schematically illustrating a nonvolatile memory module and a memory module controller according to still another embodiment of the inventive concept. A nonvolatile memory module and a memory module controller in FIG. 9 may be similar to the nonvolatile memory module and the memory module controller in FIG. 9. Thus, same or similar components are illustrated using same or similar reference numerals, and the description of these components is not repeated.

A nonvolatile memory module 110 of FIG. 9 may be configured to divide SPD information into a plurality of sub SPD information and to distribute the plurality of sub SPD information into the plurality of nonvolatile memory devices. A read operation on the SPD information can be performed in parallel at the plurality of nonvolatile memory devices. As a result, the read operation may be performed rapidly.

Referring to FIG. 9, the nonvolatile memory module 110 may include a plurality of nonvolatile memory devices 111 to 11n. Each of the nonvolatile memory devices 111 to 11n may include an SPD area (e.g., 131 to 13n). Sub SPD information such as sectors 11, 12, and 13 of SPD area 131, may be stored at SPD areas 131 to 13n, respectively.

Each of the SPD areas 131 to 131l may include a plurality of sectors. For example, as illustrated in FIG. 9, each of the SPD areas 131 to 13n may include three sectors. Each sector may be formed of memory cells sharing the same word line. For example, sectors sector 11 to sector n1 may be formed of memory cells corresponding to the same word line. However, the inventive concept is not limited thereto.

SPD information may be distributed into and stored at sectors of the nonvolatile memory devices 111 to 11n. For example, the SPD information may be distributed into and stored at sector 11 to sector n1 of the nonvolatile memory devices 111 to 11n.

The SPD information may be distributed into and stored at sector 11 to sector n1 of the nonvolatile memory devices 111 to 11n. In other words, a set of data stored at the sectors 11 to n1 of the nonvolatile memory devices 111 to 11n may constitute SPD information.

Also, the SPD information stored at each sector is referred herein as sub SPD information. For example, data stored at the first sector 11 of the nonvolatile memory device 111 may be referred to as first sub SPD information. Data stored at the nth sector n1 of the nonvolatile memory device 11n may be referred to as nth sub SPD information. In this case, the first to nth sub SPD information may as a whole constitute the SPD information.

At power-on, the memory module controller 120 may send a parallel read command PRC to the nonvolatile memory module 110. The nonvolatile memory module 110 may perform read operations on the first sector 11 to sector n1 of the nonvolatile memory devices 111 to 11n in response to the parallel read command PRC. Since the nonvolatile memory devices 111 to 11n perform the read operations simultaneously, the nonvolatile memory module 110 according to an embodiment of the inventive concept may efficiently perform a read operation on the SPD information. Moreover, the memory module controller 120 may set a communication mode with the nonvolatile memory module 110 by combining the different SPD information read from at least two of the nonvolatile memory devices 111 to 11n.

Meanwhile, to prevent the whole of the memory module from being rendered inoperable or otherwise abnormally recognized due to a read failure of sub SPD information, the nonvolatile memory module 110 according to an embodiment of the inventive concept may store the sub SPD information at sectors of a corresponding nonvolatile memory device in plurality.

For example, as illustrated in FIG. 9, first sub SPD information may be iteratively stored at sector 11 to sector 13 of the nonvolatile memory device 111. In other words, multiple copies of the first sub SPD information may be stored at the individual sectors 11 to 13. Put differently, each of sectors 11 to 13 may store a same copy of the first sub SPD information. Also, in a similar fashion, nth sub SPD information may be iteratively stored at sector n1 to sector n3 of the nonvolatile memory device 11n.

If read operations fail on the sectors 11, 21, 31, n-1 to n1 of the nonvolatile memory devices 111 to 11n, the nonvolatile memory module 110 may perform read operations on sectors 12, 22, 32, n-12 to n2 of the nonvolatile memory devices 111 to 11n. Also, if read operations fail on the sectors 12 to n2 of the nonvolatile memory devices 111 to 11n, the nonvolatile memory module 110 may perform read operations on sectors 13, 23, 33, n-13 to Sector n3 of the nonvolatile memory devices 111 to 11n, and so forth. In this manner, it is possible to prevent the whole of the memory module from being rendered inoperable or otherwise abnormally recognized due to read failures of the sub SPD information stored in the various sectors.

In addition, a register 121 of the memory module controller 120 may store location information of a sector at which a read operation on SPD information is performed successfully. Also, the chip information area 141 may store location information of a sector at which a read operation on SPD information is performed successfully.

Figure 10:
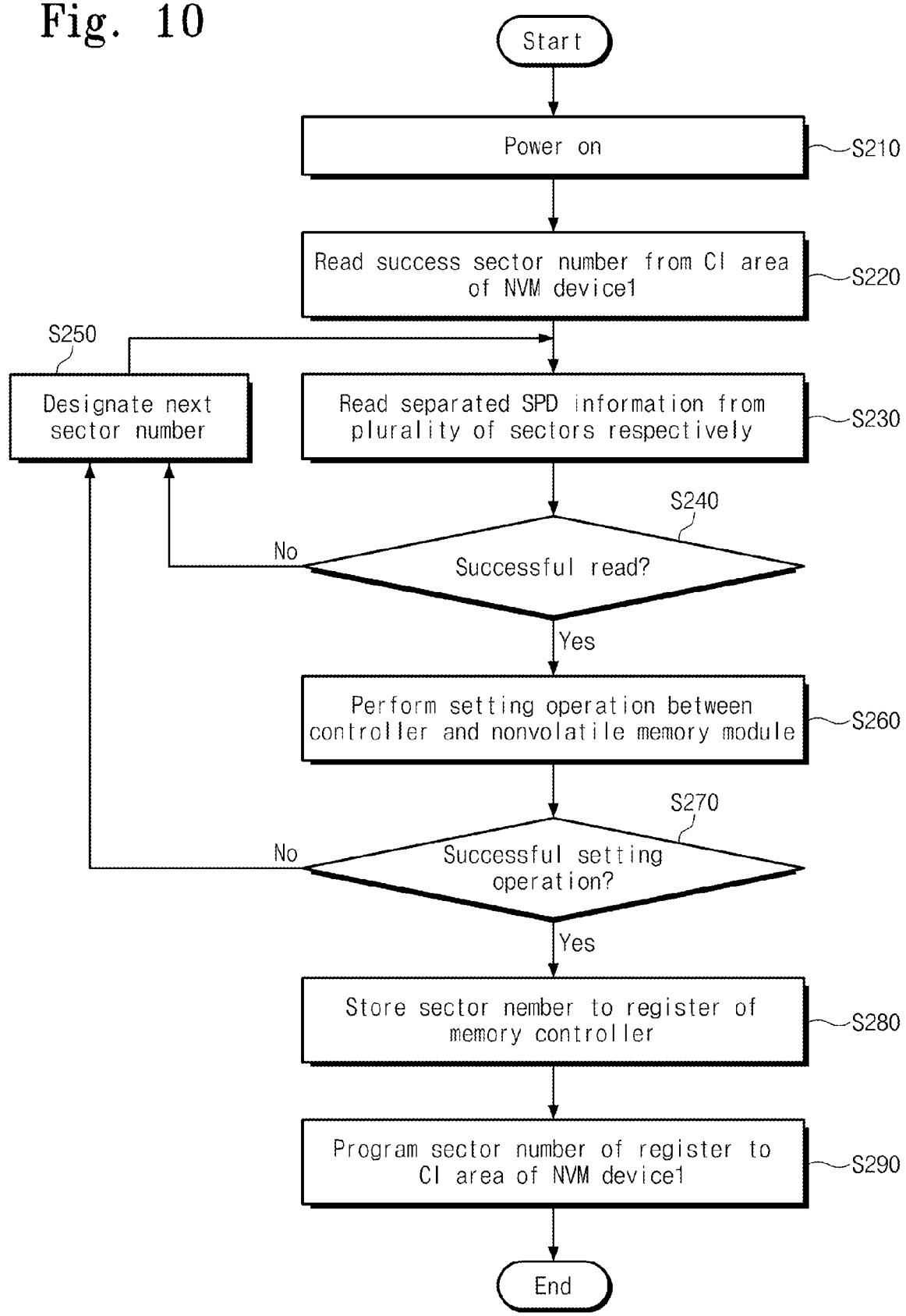
FIG. 10 is a flow chart illustrating operations of a nonvolatile memory module and a memory module controller of FIG. 9.

FIG. 10 is a flow chart illustrating operations of a nonvolatile memory module and a memory module controller of FIG. 9. Operations of a nonvolatile memory module 110 and a memory module controller 120 are more fully described below with reference to FIGS. 9 and 10.

The SPD information may be distributed into and stored at sectors having the same sector number. For example, the SPD information can be distributed into and stored at sectors 11 to n1 of nonvolatile memory devices 111 to 11n.

In this case, sub SPD information stored at the sector 11 of the nonvolatile memory device 111 may be referred to as first sub SPD information, and sub SPD information stored at the sector n1 of the nonvolatile memory device 11n may be referred to as nth sub SPD information. Also, each SPD area may include three sectors. Sectors in the same SPD area may store the same sub SPD information.

In operation S210, a computing system 10 (refer to FIG. 1) may be powered on. In operation S220, a read operation may be performed on a success sector number stored at a chip information area 141 of the nonvolatile memory device 111. More specifically, the memory module controller 120 may send a read request on a success sector number stored at the chip information area 141 to the nonvolatile memory device 111. The nonvolatile memory device 111 may perform a read operation on the success sector number stored at the chip information area 141, and may send a read result to the memory module controller 120.

In operation S230, a read operation may be performed on sectors of a nonvolatile memory device corresponding to the success sector number. That is, the memory module controller 120 may send to the nonvolatile memory devices 111 to 11n a read request on a sector previously designated to store valid SPD information at a previous power-on, based on the success sector number.

The nonvolatile memory devices 111 to 11n may perform a read operation on sub SPD information stored at a sector corresponding to the success sector number, respectively. For ease of description, the sectors 11 to n1 may correspond to the success sector number.

In operation S240, a determination can be made whether a read operation on the SPD information succeeds or fails. More specifically, a determination can be made whether a read operation of the SPD information on the sectors 11 to n1 corresponding to the success sector number is a success or a failure.

If the read operations on the sectors 11 to n1 fail, the flow proceeds to operation S250, where next sectors (e.g., sector 12 to sector n2) may be designated as sectors at which a read operation can be newly performed.

For example, if the read operations on the sectors 11 to n1 fail, the nonvolatile memory module 110 may newly designate the sectors 12 to n2 in response to a parallel read command PRC (of FIG. 9), after which the flow proceeds to operation S230.

If the read operations on the sectors 11 to n1 are performed successfully, the flow proceeds to operation S260, where a setting operation may be performed between the memory module controller 120 and the nonvolatile memory module 110.

In operation S270, a determination is made whether the setting operation is successful or not. If the setting operation between the memory module controller 120 and the nonvolatile memory module 110 fails, the flow proceeds to operation S250 in which the sectors 12 to n2 are newly designated, after which the flow proceeds to operation S230.

If the setting operation between the memory module controller 120 and the nonvolatile memory module 110 is successful, the flow proceeds to operation S280, where location information of corresponding sectors may be stored at a register 121 of the memory module controller 120. That is, location information of sectors at which a read operation on the SPD information is successfully performed may be stored at the register 121 as success chip information.

In operation S290, the success chip information stored at the register 121 may also be stored at the chip information area 141 of the nonvolatile memory device 111.

Determining whether a read operation of the SPD information is successful (S240) may include checking and correcting an error on the read SPD information. In the case that the memory module controller 120 does not support an error checking function on the SPD information, the operation S240 may be skipped.

As described with reference to FIGS. 9 and 10, the nonvolatile memory module 110 according to an embodiment of the inventive concept may include a plurality of nonvolatile memory devices, in which SPD information may be distributed into and stored at the plurality of nonvolatile memory devices. In this case, a read operation on the SPD information may be performed in parallel at the plurality of nonvolatile memory devices. Thus, a read speed of the SPD information may be improved. Also, as the SPD information is iteratively stored, it is possible to prevent the whole of the nonvolatile memory module from being rendered inoperable or otherwise abnormally recognized due to read failures of the SPD information.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory module comprising:
    a plurality of nonvolatile memory devices, each of the plurality of nonvolatile memory devices communicating data with an external memory module controller; and
    a connector providing connection between the plurality of nonvolatile memory devices and the external memory module controller,
    wherein one of the plurality of nonvolatile memory devices comprises a plurality of memory cell arrays, and one of the plurality of memory cell arrays stores serial presence detect (SPD) information, and
    wherein the one of the plurality of memory cell arrays storing the SPD information comprises a plurality of nonvolatile memory cells, and the other of the plurality of memory cell arrays comprise a plurality of nonvolatile memory cells which are the same type of memory cells with the plurality of nonvolatile memory cells included in the one of the plurality of memory cell arrays storing the SPD information.

2. The nonvolatile memory module of claim 1, wherein the each of the plurality of nonvolatile memory devices receives a read command or a write command from the external memory module controller using a common signal line.

3. The nonvolatile memory module of claim 2, wherein the each of the plurality of nonvolatile memory devices outputs read data respectively to the external memory module controller through dedicated signal line in responsive to the read command.

4. The nonvolatile memory module of claim 2, wherein the each of the plurality of nonvolatile memory devices receives write data respectively from the external memory module controller through dedicated signal line in responsive to the write command.

5. The nonvolatile memory module of claim 1, wherein the one of the plurality of nonvolatile memory devices outputs the SPD information to the external memory module controller after power is supplied to the nonvolatile memory module.

6. The nonvolatile memory module of claim 1, wherein the plurality of nonvolatile memory devices are configured to be used as a working memory of an external processor coupled to the external memory module controller.

7. The nonvolatile memory module of claim 1, wherein the one of the plurality of memory cell arrays comprises a plurality of memory banks and at least one memory bank among the plurality of the memory banks is designated as area for storing the SPD information.

8. The nonvolatile memory module of claim 7, wherein the at least one memory bank designated as area for storing the SPD information comprises a plurality of memory cells which are the same types of memory cells with a plurality of memory cells included in the other memory banks which are not designated as area for storing the SPD information.

9. The nonvolatile memory module of claim 1, wherein the nonvolatile memory module is one of single inline memory module (SIMM) or dual inline memory module (DIMM).

10. The nonvolatile memory module of claim 1, wherein at least one of the plurality of nonvolatile memory devices is configured to interface with the external memory module controller using DRAM interface.

11. A control method of a memory module, the method comprising:
    reading serial presence detect (SPD) information, by an external memory module, from one of a plurality of nonvolatile memory devices included in the memory module via a connector which provides connection between the external memory module and the plurality of nonvolatile memory devices, the one of the plurality of nonvolatile memory devices comprising a plurality of memory cell arrays and the SPD information being stored in one of the plurality of memory cell arrays; and
    setting a communication mode between the memory module and the external memory module based on the SPD information read from the one of the plurality of nonvolatile memory cell arrays, wherein the one of the plurality of memory cell arrays storing the SPD information comprises a plurality of nonvolatile memory cells, and the other of the plurality of memory cell arrays comprise a plurality of nonvolatile memory cells which are the same type of memory cells with the plurality of nonvolatile memory cells included in the one of the plurality of memory cell arrays storing the SPD information.

12. The control method of claim 11, further comprising:
reading alternative SPD information from another one of the plurality of nonvolatile memory devices included in the memory module when the setting of the communication mode fails,
wherein the alternative SPD information in the another one of the plurality of nonvolatile memory devices is duplicated information from the SPD information in the one of the plurality of nonvolatile memory devices.

13. The control method of claim 11, wherein:
each of the plurality of nonvolatile memory devices communicates data with the external memory module controller in parallel.

14. The control method of claim 11, wherein:
at least one of the plurality of nonvolatile memory devices included in the memory module is configured to interfaces with the external memory module controller using DRAM interface.

15. The control method of claim 11, wherein:
the memory module is one of single inline memory module (SIMM) or dual inline memory module (DIMM).

16. A memory system comprising:
a processor;
a storage device storing user data under control of the processor; and
a memory module receiving a read command or a write command from the processor and being used as a working memory to process the read command or write command for the processor,
wherein the memory module comprises a plurality of nonvolatile memory devices, one of the plurality of nonvolatile memory devices comprises a plurality of memory cell arrays, and one of the plurality of memory cell arrays stores serial presence detect (SPD) information, and
wherein the one of the plurality of memory cell arrays storing the SPD information comprises a plurality of nonvolatile memory cells, and the other of the plurality of memory cell arrays comprise a plurality of nonvolatile memory cells which are the same type of memory cells with the plurality of nonvolatile memory cells included in the one of the plurality of memory cell arrays storing the SPD information.

17. The memory system of claim 16, further comprising:
a memory module controller communicating data with the memory module under control of the processor; and
a connector providing connection between the memory module and the memory module controller,
wherein each of the nonvolatile memory devices included in the memory module receives the read command or the write command from the memory module controller via the connector using a common signal line.

18. The memory system of claim 17, wherein the one of the plurality of nonvolatile memory devices outputs the SPD information to the memory module controller after power is supplied to the memory module.

19. The memory system of claim 17, wherein at least one of the plurality of nonvolatile memory devices is configured to interface with the memory module controller using DRAM interface.

20. The memory system of claim 16, wherein the memory module is one of single inline memory module (SIMM) or dual inline memory module (DIMM).

* * * * *